(12) United States Patent
Forrest et al.

(10) Patent No.: US 9,861,234 B2
(45) Date of Patent: Jan. 9, 2018

(54) OIL RECLAMATION DEVICE AND PROCESS

(75) Inventors: Paul G. Forrest, Baltimore, MD (US); Ronald F. Jacobs, Baltimore, MD (US); Charles Amoss, Baltimore, MD (US)

(73) Assignee: ILLINOIS TOOL WORKS, INC., Glenview, IL (US)

( * ) Notice: Subject to any disclaimer, the term of this patent is extended or adjusted under 35 U.S.C. 154(b) by 1400 days.

(21) Appl. No.: 11/675,455

(22) Filed: Feb. 15, 2007

(65) Prior Publication Data

US 2008/0196596 A1   Aug. 21, 2008

(51) Int. Cl.
*A47J 37/12* (2006.01)

(52) U.S. Cl.
CPC ....... *A47J 37/1285* (2013.01); *A47J 37/1219* (2013.01); *A47J 37/1223* (2013.01); *H01L 2224/16225* (2013.01); *H01L 2224/32225* (2013.01); *H01L 2224/73204* (2013.01); *H01L 2924/3511* (2013.01)

(58) Field of Classification Search
CPC .... A47J 36/20; A47J 37/1223; A47J 37/0786; A47J 27/18; A21B 3/155; A23B 4/285; A01K 63/045; E04H 4/1263; C02F 3/1257; C02F 3/1242; C02F 3/1263; C02F 1/42; B01D 35/0273; B01D 35/26; B01D 33/0064; B01D 27/06
USPC ................ 99/403, 408, 330, 444, 450, 487; 210/167.01, 167.2, 194, 195.1, 167.28, 210/172.3, 416.1, 196, 135, 142, 428, 210/DIG. 8

See application file for complete search history.

(56) References Cited

U.S. PATENT DOCUMENTS

| | | | |
|---|---|---|---|
| 445,223 A | 1/1891 | Knight | |
| 2,359,368 A | 8/1941 | Klopfenstein | |
| 2,424,211 A | 7/1947 | Webb | |
| 2,578,129 A | 12/1951 | Daugherty | |
| 2,610,740 A | 9/1952 | Hunter | |
| 2,635,527 A | 4/1953 | Overbeck et al. | |
| 2,760,641 A | 8/1956 | Mies, Jr. et al. | |
| 2,914,063 A | 11/1959 | Wagner | |
| 3,045,827 A | 7/1962 | Hough | |
| 3,107,601 A | 10/1963 | Longmire | |
| 3,147,220 A | 9/1964 | Avery | |
| 3,159,095 A | 12/1964 | Wagner | |
| 3,263,818 A | 8/1966 | Gedrich | |
| 3,279,605 A | 10/1966 | Shepherd | |
| 3,410,199 A | 11/1968 | Quednau | |
| 3,477,361 A | 11/1969 | Bradshaw | |
| 3,483,981 A | 12/1969 | Gordon | |
| 3,608,472 A * | 9/1971 | Pelster et al. | 99/327 |
| 3,648,595 A * | 3/1972 | Morris | 99/342 |
| 3,649,290 A | 3/1972 | Angold | |
| 3,667,374 A | 6/1972 | Holman | |
| 3,685,433 A * | 8/1972 | Cunningham | 99/408 |
| 3,701,313 A | 10/1972 | Boggs | |
| 3,735,693 A * | 5/1973 | Pelster et al. | 99/408 |
| 3,735,871 A | 5/1973 | Blake | |

(Continued)

FOREIGN PATENT DOCUMENTS

EP   0649622   4/1995

*Primary Examiner* — Thien S Tran
(74) *Attorney, Agent, or Firm* — Baker Hostetler LLP

(57) ABSTRACT

A fryer filtration arrangement includes an oil reclamation system to reclaim used filtered cooking oil.

11 Claims, 3 Drawing Sheets

(56) References Cited

U.S. PATENT DOCUMENTS

| | | | |
|---|---|---|---|
| 3,797,378 A * | 3/1974 | Morris | 99/408 |
| 3,894,482 A | 7/1975 | Murphy | |
| 3,938,498 A * | 2/1976 | Price | 219/437 |
| 3,968,741 A * | 7/1976 | Hunt | 99/330 |
| 3,973,481 A | 8/1976 | Mies | |
| 4,084,492 A | 4/1978 | Sullivan | |
| 4,113,623 A | 9/1978 | Koether et al. | |
| 4,324,173 A | 4/1982 | Moore et al. | |
| 4,328,097 A | 5/1982 | Whaley et al. | |
| 4,460,818 A | 7/1984 | Anetsberger et al. | |
| 4,485,831 A * | 12/1984 | Ungerleider | 137/1 |
| 4,487,691 A | 12/1984 | Panora | |
| 4,591,434 A | 5/1986 | Prudhomme | |
| 4,604,203 A | 8/1986 | Kyle | |
| 4,607,857 A | 8/1986 | LeSage et al. | |
| 4,623,544 A | 11/1986 | Highnote | |
| 4,646,793 A * | 3/1987 | Sherratt | 141/1 |
| 4,747,944 A | 5/1988 | George | |
| 4,768,426 A | 9/1988 | Nett | |
| 4,785,725 A | 11/1988 | Tate et al. | |
| 4,805,525 A | 2/1989 | Bivens | |
| 4,826,590 A | 5/1989 | Turman | |
| 4,890,548 A | 1/1990 | Grob et al. | |
| 4,895,137 A | 1/1990 | Jones et al. | |
| 4,899,649 A | 2/1990 | Grob et al. | |
| 4,913,042 A * | 4/1990 | Miller | 99/404 |
| 4,945,893 A * | 8/1990 | Manchester | 126/391.1 |
| 4,974,501 A | 12/1990 | Grob et al. | |
| 4,994,181 A | 2/1991 | Mullaney, Jr. | |
| 5,247,876 A * | 9/1993 | Wilson et al. | 99/408 |
| 5,253,566 A | 10/1993 | McCabe et al. | |
| RE34,636 E | 6/1994 | Bivens | |
| 5,404,799 A | 4/1995 | Bivens | |
| 5,449,469 A | 9/1995 | Burklund et al. | |
| 5,486,370 A | 1/1996 | Bivens | |
| 5,577,438 A | 11/1996 | Amitrano et al. | |
| 5,582,093 A | 12/1996 | Amitrano et al. | |
| 5,595,107 A | 1/1997 | Bivens | |
| 5,597,601 A * | 1/1997 | Griffin | 426/417 |
| 5,680,811 A | 10/1997 | Highnote et al. | |
| 5,709,899 A | 1/1998 | Bivens | |
| 5,731,024 A | 3/1998 | Bivens | |
| 5,743,175 A | 4/1998 | Crain et al. | |
| 5,839,360 A * | 11/1998 | Williams | 99/408 |
| 5,870,945 A | 2/1999 | Bivens | |
| 6,235,210 B1 | 5/2001 | Saksena | |
| 6,306,294 B1 | 10/2001 | Blair | |
| 6,330,852 B1 * | 12/2001 | Williams | 99/408 |
| 6,378,420 B1 * | 4/2002 | Savage et al. | 99/408 |
| 6,470,794 B2 * | 10/2002 | Takahashi | 99/408 |
| 6,572,764 B2 * | 6/2003 | Mullaney, Jr. | 210/167.28 |
| 6,783,685 B2 * | 8/2004 | Hwang | 210/690 |
| 6,792,983 B2 | 9/2004 | Allora | |
| 2002/0069767 A1 * | 6/2002 | Wendel et al. | 99/403 |
| 2002/0174778 A1 * | 11/2002 | Petrusha | 99/336 |
| 2003/0196940 A1 * | 10/2003 | Mullaney, Jr. | 210/167 |
| 2004/0007137 A1 * | 1/2004 | Hwang | 99/330 |
| 2004/0159243 A1 | 8/2004 | Theodos | |
| 2004/0163547 A1 * | 8/2004 | Kijimoto | 99/330 |
| 2005/0072309 A1 * | 4/2005 | Mullaney, Jr. | 99/330 |
| 2006/0076281 A1 * | 4/2006 | Aldeguer | 210/167 |

\* cited by examiner

OIL RECLAMATION DEVICE AND PROCESS

BACKGROUND OF THE INVENTION

1. Field of the Invention

The invention relates generally to deep fryers, and more particularly, to deep fryers that are used in conjunction with a cooking oil reclamation system and process.

2. Related Art

A typical deep fryer includes a fryer vat containing a heating bath of cooking oil. The fryer is typically adapted to receive baskets of food products such that the food products will be immersed within and cooked by the heated cooking oil.

To extend the useful life of the cooking oil, it is a common practice to filter the particulate food matter from the cooking oil from time to time to minimize the carbonization of such food matter within the cooking oil with a filter system in the deep fryer.

When reuse of cooking oil is no longer possible or desired, the oil must be drained from the fryer so that it can be safely discarded. This can be a messy and difficult process. Accordingly, many users rely on an oil reclamation service and/or system to hold the discarded oil to be reclaimed. Typical oil reclamation systems permit connection to a fryer from only one location with respect to the fryer, i.e. from the front or back. Accordingly, the filter system or other outlet may have to be disconnected and the oil reclamation system connected when each is used making oil reclamation, connecting to a other outlet and filtering more difficult. Improvements in the fryer and methods for easily draining used cooking oil from the fryer using a other outlet and filtering the oil are sought.

SUMMARY OF THE INVENTION

The invention meets the foregoing needs and provides a simple method of switching between oil reclamation, other outlet and filtering and has other advantages apparent from the discussion herein.

Accordingly, in one aspect of the invention a fryer may include a fryer vat configured to fry food in an oil, a filter system arranged to receive the oil and filter the oil, a conduit that directs the oil from the filter system to the fryer vat, a oil reclamation system that receives the oil for oil reclamation, a reclamation conduit that directs the oil from the fryer to the oil reclamation system, and a flow control device that selectively directs the oil to one of the reclamation conduit or the conduit. The fryer vat may include a plurality of fryer vats configured to fry food in the oil. The filter system may be arranged to selectively receive the oil and filter the oil from one of the plurality of fryer vats. The filter system may also include a pan for receiving oil drained from the fryer vat and a filter assembly within the pan for filtering the oil. The filter system may further include an oil drain path leading from an outlet opening of the fryer vat to the pan and an automated drain valve located along the oil drain path. The oil reclamation system may include a storage tank that receives the oil for oil reclamation. The oil reclamation system may further include a pump located for delivering oil from the filter system through one of the conduit and the reclamation conduit. The flow control device may include one of a manual valve and an automatic valve. The flow control device may be further configured to direct oil to one of the reclamation conduit, the conduit, or an outlet arranged on the fryer. The fryer may further include a control unit connected for controlling the automatic valve and the pump.

In another embodiment of the invention, a fryer may include a fryer vat configured to fry food in an oil, a filter system arranged to receive the oil and filter the oil, a conduit arranged to direct the oil from the filter system to the fryer vat, a oil reclamation system arranged to receive the oil for oil reclamation, a reclamation conduit arranged to direct the oil from the filter system to the oil reclamation system, and means for controlling flow arranged to selectively direct the oil to one of the reclamation conduit or the conduit. The fryer vat may include a plurality of fryer vats configured to fry food in the oil. The filter system may be arranged to selectively receive the oil and filter the oil from one of the plurality of fryer vats. The filter system may include a pan for receiving oil drained from the fryer vat and a filter assembly within the pan for filtering the oil. The filter system may further include an oil drain path leading from an outlet opening of the fryer vat to the pan and an automated drain valve located along the oil drain path. The oil reclamation system may include a storage tank that receives the oil for oil reclamation. The fryer may further including a pump arranged to deliver oil from the filter system through one of the conduit and the reclamation conduit. The flow controlling means may include at least one of a manual valve and an automatic valve. The flow controlling means may be configured to direct oil to one of the reclamation conduit, the conduit, or an outlet arranged on the fryer. A control unit may be connected for controlling the automatic valve and the pump.

In a further embodiment of the invention a process of modifying a fryer for oil reclamation including a fryer vat configured to fry food in oil, a filter system arranged to receive the oil and filter the oil, a conduit arranged to direct the oil from the filter system to the fryer vat includes the steps of arranging an oil reclamation system to receive the oil for oil reclamation proximate to the fryer, connecting a reclamation conduit to the oil reclamation system to direct the oil from the fryer to the oil reclamation system, and connecting a flow control device to the fryer and the reclamation conduit that selectively directs the oil to one of the reclamation conduit or the conduit.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and the various ways in which it may be practiced. In the drawings.

DETAILED DESCRIPTION OF THE INVENTION

Figure 1:
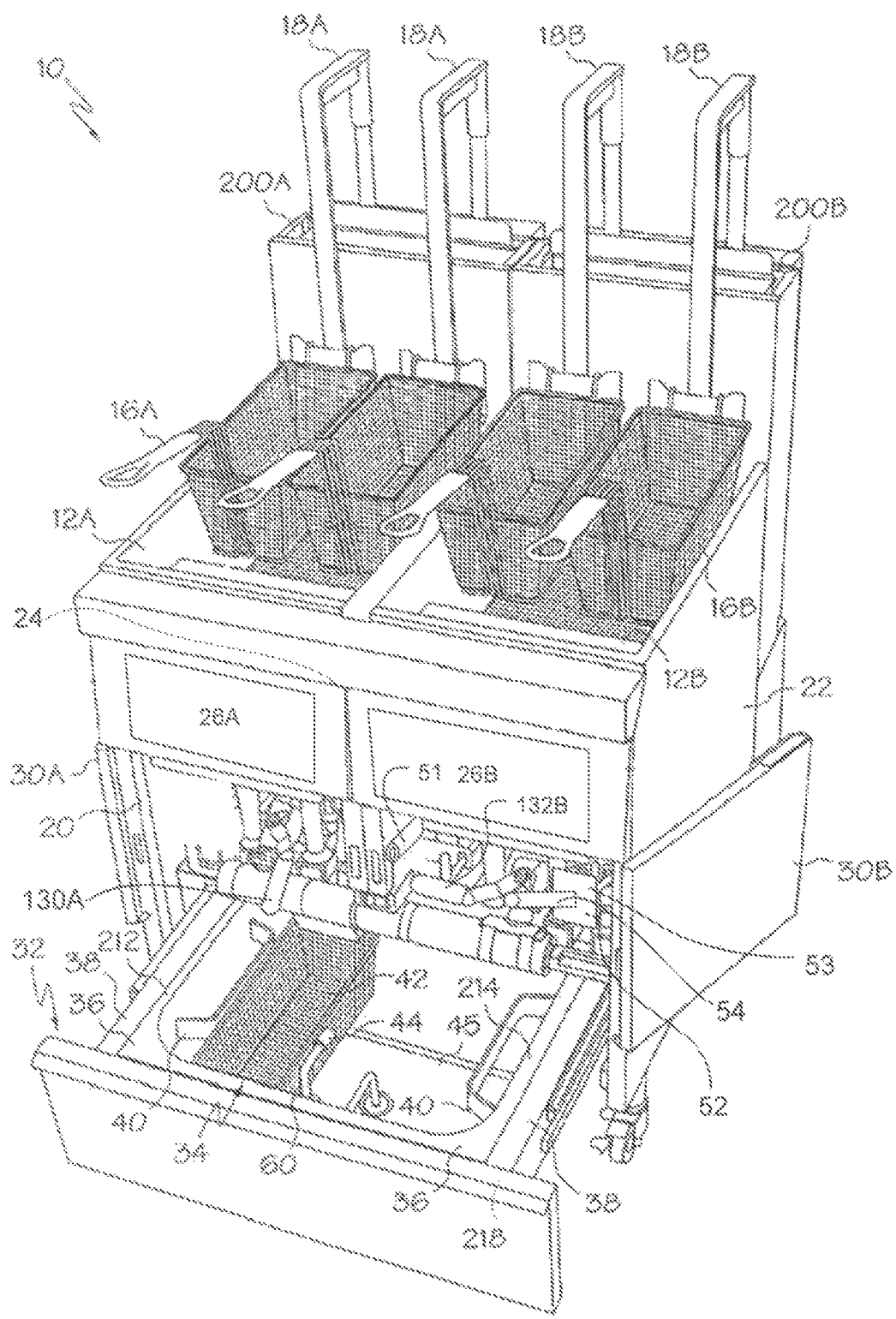
FIG. 1 is a front perspective of one embodiment of a fryer including a filtration and reclamation arrangement constructed according to the principles of the invention.

The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals represent similar parts throughout the drawings.

FIG. 1 is a perspective view of a typical fryer 10 including two fryer vats 12A and 12B. Each fryer vat 12A and 12B may include at least one respective basket 16A and 16B which may be manually or automatically movable upward and downward via respective positioning guides 18A and 18B or the like in a manner well known in the art. The fryer 10 may include a frame 20 that may include an associated housing 22 made of stainless steel, for example. A front panel 24 of the fryer 10 may include a control and display panel 26A and 26B for each fryer vat for control of the operation of the fryer 10. The lower portion of the housing frame 20 may include a set of doors 30A, 30B that may be movable between open and closed positions, and which are illustrated in the open position.

Below the doors 30A, 30B, a drawer 32 may be arranged and may be movable between open and closed positions relative to the frame 20, the drawer 32 being illustrated in the open position in FIG. 1. Positioned within the drawer 32 may be an oil receiving pan 34. As used herein, the term "pan" is intended to broadly encompass any oil receiving container, unless otherwise specifically indicated. The pan 34 has a rim 36 that sits on drawer frame 38 of the drawer 32. The drawer 32 also may include a drawer front 218 to conceal the drawer 32. Handles 40 may be arranged to extend from the interior sidewalls of the pan 34 to allow the pan to be easily picked up and removed from the drawer 32 to facilitate cleaning at a location away from the fryer 10. Positioning of the handles 40 on the inner portion of the pan helps facilitate simple positioning of the pan in the drawer 32.

The fryer 10 may include a filtration system that may include a basket type screen 42 that may be removably positioned within the pan 34 for filtering out debris entering the pan 34 within oil which is drained from one of the fryer vats 12A and 12B. At the bottom of the pan 34, a filter assembly 45 may be provided for filtering the oil. An oil return path from the pan 34 back to the fryer vat 12A, 12B may be formed in part by piping 60 and a coupler 44 which may be connected to and extend from a front sidewall of the pan 34. The illustrated piping 60 and coupler 44 may extend upward from the pan 34 and rearwardly back toward the fryer frame 20. A corresponding coupler (not shown) may be positioned on the fryer frame 20, with the two couplers aligned for slidingly mating with each other in a friction fit arrangement when the drawer 32 is moved to a closed position.

In the illustrated fryer 10, each vat 12A, 12B may include an associated exhaust stack 200A, 200B formed at the back of the fryer for venting combustion gases produced by the oil heating system that may include vat fire tubes.

Figure 2:
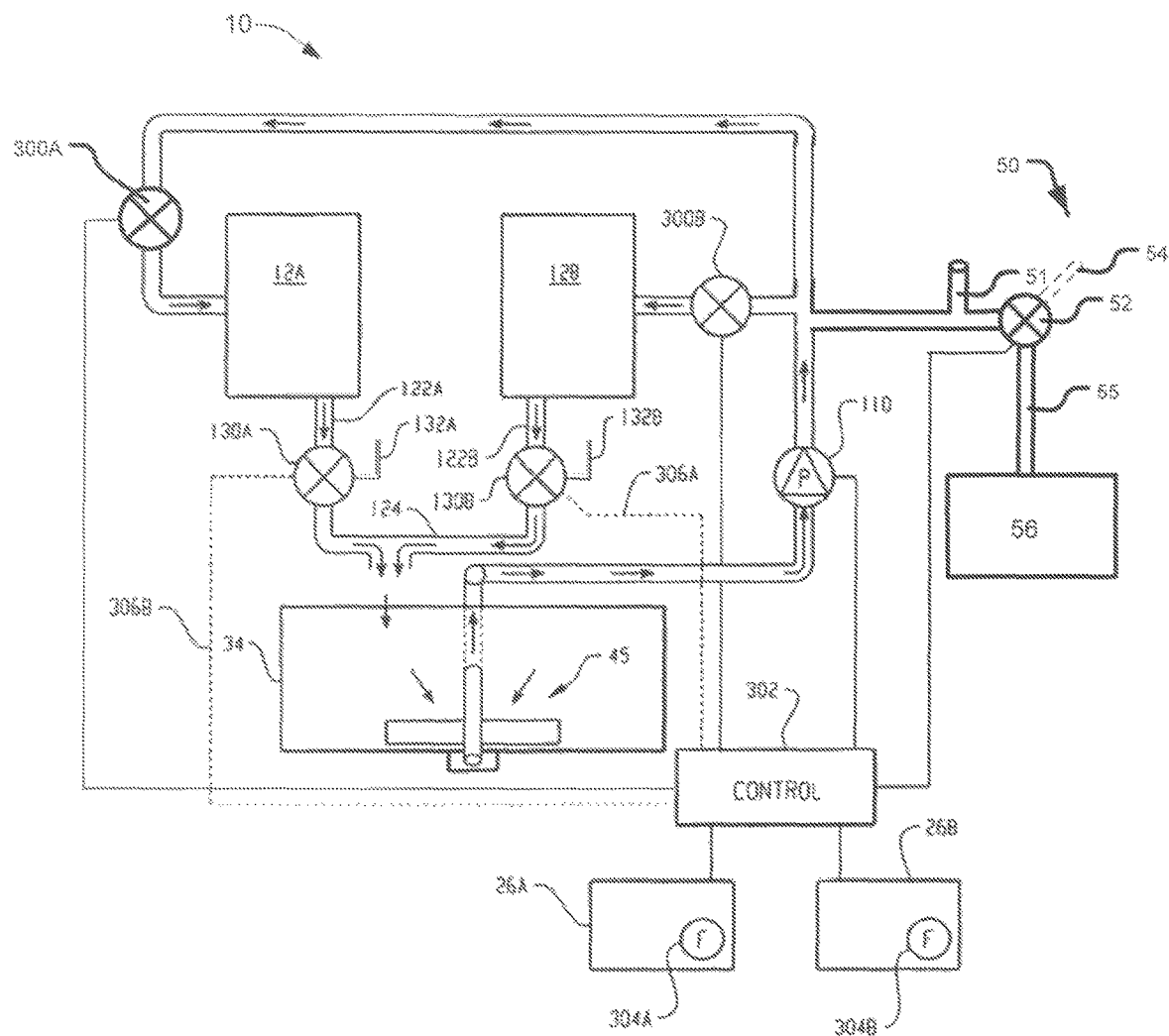
FIG. 2 is a schematic depiction of a fryer oil filtration and reclamation arrangement according to FIG. 1.

As further shown in FIG. 2, the fryer of the invention also includes an oil reclamation system 50 (not shown in FIG. 1) that allows used filtered cooking oil to be removed to a storage tank so that it can easily be reclaimed. Additionally, the oil reclamation system 50 may include an outlet 51 that may be a male fitting. The outlet 51 may be coupled with flexible piping that a user may use to direct oil from the pan 34 back to the fryer vats 12A and 12B for directed cleaning to wash down the vats 12A and 12B. For example, the outlet 51 may be include a quick disconnect that remains closed when it is not connected.

In order to switch where the oil is to be sent, a valve 52 with operating handle 54 may be arranged to direct the oil to the filtration system (so as to return the oil to the vats 12A and 12B) or to the oil reclamation system 50 either by manual or automatic operation of the valve 52. This allows the user to selectively connect to the oil reclamation system 50, another outlet such as the outlet 51, or the filter system without having to disconnect connections to oil reclamation system, the front outlet or filtration system making oil reclamation, cleaning and filtering easier and less messy.

The valve 52 may be a lockable stainless steel ball valve, gate valve, or the like, for example. The valve handle 54 and valve 52 may be mounted on a valve mounting bracket 53. The valve 52 directs the flow of the oil to the front or rear of the fryer via a discard conduit 55. The discard conduit 55 may be coupled so that oil may be discarded easily from either the outlet 51 or the rear of the fryer 10. For example, discard conduit 55 may drain into a used oil reclamation tank 56 so that the oil may be disposed.

For a filtering operation of vat 12A, handle 132A is used to manually open valve 130A to permit oil to drain from vat 12A (along the path including 122A and 124) into the pan 34. The user then depresses or otherwise activates the filter input switch 304A, which triggers the control unit 302 to open the valve 300A and turn on the pump 110 so that the oil is filtered (in the same manner described above with respect to FIG. 1). The user manually closes the valve 130A when filtering is complete and it is desired to return all oil to the vat 12A. For a filtering operation of vat 12B, handle 132B may be used to manually open valve 130B to permit oil to drain from vat 12B (along the path including 122B and 124) into the pan 34. The user then depresses or otherwise activates the filter input switch 304B, which triggers the control unit 302 to open the valve 300B and turn on the pump 110 so that the oil is filtered. The user manually closes the valve 130B when filtering is complete and it is desired to return all oil to the vat 12B.

FIG. 2 further depicts an optional embodiment of the invention where a control unit 302 is added to automatically control the valves. In particular, control unit 302 may be connected to automated valves 300A, 300B, and 52 to control the OPEN/CLOSED state of the valves. In one example, the valves 300A, 300B, and 52 are normally closed solenoid valves, but other types of automated valves could be used. The control unit 302 may be connected for controlling the pumping operations of the pump 110, and also may be connected with the control and display panels 26A and 26B. In one embodiment, each control and display panel includes a respective filter input switch 304A and 304B, which in one embodiment may be respective rocker switches.

In an alternative arrangement, the valves 300A, 300B, 52 and pump 110 could be replaced by a first pump at the location of valve 300A, a second pump at the location of valve 300B and a third pump at the location of valve 52.

In another arrangement, a single filter input switch could be provided and the control unit 302 may be connected to sense which of valves 130A or 130B is open, with such sensing being used to determine which of valves 300A or 300B to open in response to triggering of the filter input switch.

In an alternative embodiment, the valves 130A and 130B could also be provided as automated valves, with the control unit connected to the respective valves as indicated by dashed lines 306A and 306B. In one such embodiment, for a filtering operation of vat 12A, the user simply depresses or otherwise activates filter input switch 304A and the control unit responsively opens valve 130A, waits a period of time to allow for at least some oil drainage into the pan 34, and then opens the valve 300A and turns on the pump 110 so that the oil is filtered. In another such embodiment, the filter input switch could be eliminated and the control unit could trigger a filtering operation on a timed basis or, for example, each time the fryer is turned off. In one implementation the control unit 302 may automatically run the filtering operation for a set time period before automatically closing the valve 130A in order to refill the vat 12A. In another implementation the control unit 302 may continue the filtering operation until the user depresses or otherwise activates the filter input switch 304A a second time, causing the control unit to responsively close the valve 130A in order to refill the vat 12A. A filtering operation for vat 12B would be similar to that described for vat 12A.

In the more fully automated embodiment, an interlock (in the form of a pan closed sensor) may be provided to prevent the valves 130A or 130B from being opened when the drawer/pan 34 is not in the closed position. Where the ability to drain the fryer vats 12A and 12B under no power conditions is considered important, valves 130A and 130B could be combined automated/manual valves or, secondary manual drainage valves could be provided. It should be noted that any combination of manual, solenoid, or automated valves is contemplated for use in the invention. Moreover, the use of lever actuated relay switches, microprocessor control, or the like is also contemplated for use in the invention.

While the filter switch or switches 304A and 304B are shown on the control and display panels 26A and 26B, the switches could be located elsewhere on the fryer, including internally of the fryer doors 30A, 30B.

The oil reclamation system 50 described with reference to FIG. 1 is shown in FIG. 2 positioned between the pump 110 and valves 300A and 300B. Valve 52 directs the flow of oil to the rear of the fryer and then through discard conduit 55. The discarded oil is collected in the oil reclamation tank 56 for reclamation. In an embodiment of the invention, the outlet 51 may be positioned before the valve 52 providing the outlet 51 for oil flow.

In this arrangement, if valves 300A and 300B leading to fryer vats 12A and 12B are closed and valve 52 is open, filtered oil may be pumped by pump 110 to the oil reclamation tank 56. If valve 52 is closed and one of valves 300A and 300B are open, filtered oil will be pumped by pump 110 to one of fryer vats 12A and 12B. If valve 300A, 300B, and 52 are closed and a hose is connected to the outlet 51, oil will flow through the hose which may be directed to the vats 12A, 12B or elsewhere.

While the oil reclamation system 50 shown in FIG. 2 is positioned and attached between the pump 110 and valves 300A and 300B, it may have other positions within the scope and spirit of the invention.

Figure 3:
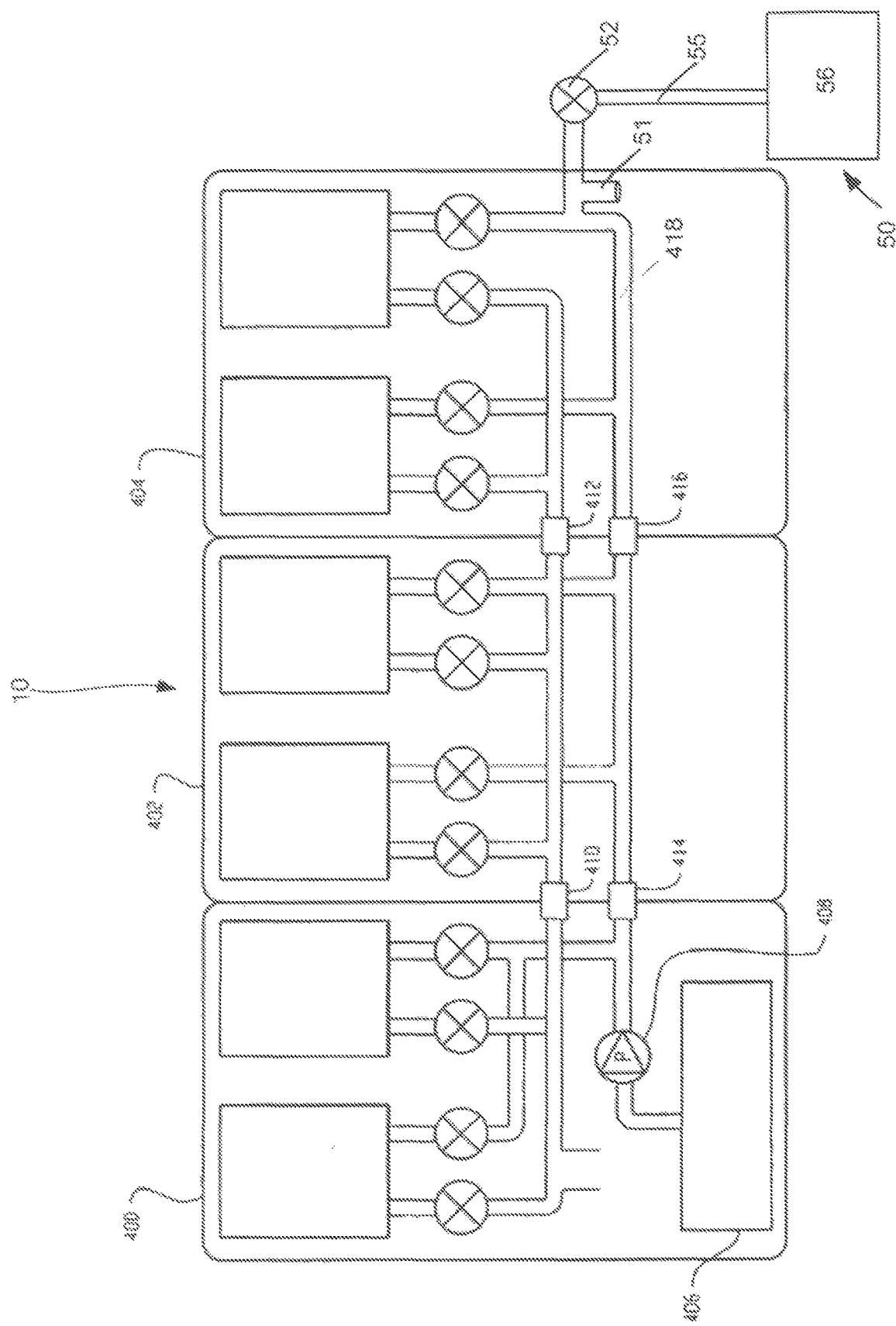
FIG. 3 is a schematic depiction of multiple fryers with a fryer oil filtration and reclamation arrangement constructed according to the principles of the invention.

Referring to FIG. 3, another embodiment in which multiple fryer housings 400, 402, 404 are connected together is shown, each housing may include two fryer vats. Only fryer housing 400 includes a pan 406, associated filter system and pump 408, with drain path piping and return path piping as previously described. The vats of fryer housings 402 and 404 include drain path piping that connects to the drain path piping of fryer housing 400 through couplings 410 and 412. Likewise, the vats of fryer housings 402 and 404 include associated return path piping that connects to the return path piping of the fryer housing 400 via couplings 414 and 416. Although the arrangement of FIG. 3 shows three fryer housings, any number of housings 400, 402, 404, are contemplated by the invention.

In this arrangement, the filter system of fryer housing 400 may be capable of filtering the oil of all fryer vats, including the vats of fryer housings 402 and 404, thus eliminating the need for fryer housings 402 and 404 to include the pan and related filter. It should be noted that the filter system may be located in any one or more of the housings. Appropriate electrical connections between the respective fryer housings are provided to enable, for example, a filter switch on the interface of either fryer housing 402 or 404 to trigger the operation of pump 408. Such control of the pump 408, coupled with the control of the respective drain valves (which may be automated type) and the return path valves (which may be automated type), provides filtering of the oil in any one of the vats of the multiple housing system. The oil reclamation system 50, as described above, is shown in this embodiment positioned adjacent to the recycle pipe 418.

While the filter assembly for the unit of FIG. 3 is shown in the pan in accordance with previously described embodiments, it is recognized that the filter could be located as a replaceable cartridge type filter along the oil return path from the pan (either upstream or downstream from the pump). In such an arrangement the oil return path could include piping positioned with an open end at a location spaced above the bottom wall of the pan (e.g., ½ inch to 2 inches) so that larger solid particles in the oil are collected in and remain in the pan. In addition, although the filtration system shown in FIGS. 1, 2, and 3 has been shown to be housed within the fryer 10, it is recognized that the filtration system may also be a separate external unit that may be connected to the fryer 10 when in use and disconnected from the fryer 10 when not in use.

The invention is also directed to a process of modifying a fryer in accordance with above noted description. The process may be used to modify a new fryer or a fryer installed at a restaurant or the like.

While the invention has been described in terms of exemplary embodiments, those skilled in the art will recognize that the invention can be practiced with modifications in the spirit and scope of the appended claims. These examples given above are merely illustrative and are not meant to be an exhaustive list of all possible designs, embodiments, applications or modifications of the invention.

What is claimed:
1. A fryer comprising:
at least one fryer vat configured to fry food in oil;
a filter system configured to filter the oil from the at least one fryer vat;

a first conduit that directs the oil from the at least one fryer vat to the filter system;
a second conduit that directs the oil from the filter system to the at least one fryer vat;
an oil reclamation system comprising:
  an oil reclamation tank configured to store the oil discarded from the fryer;
  a third conduit having a first end connected to the second conduit and a second end connected to the oil reclamation tank to direct the oil from the filter system to the oil reclamation tank;
  an outlet comprising a fitting connected to the third conduit between the first end and the second end of the third conduit and configured to discharge oil away from the oil reclamation tank while the third conduit is connected to the oil reclamation tank;
  a valve configured to control oil flow along the third conduit to the oil reclamation tank, the valve being arranged between the outlet and the second end of the third conduit; and
  a flow control device configured to direct the oil from the filter system to one of (a) the at least one fryer vat via the second conduit, (b) the oil reclamation tank via the second conduit and the third conduit, and (c) the outlet via the second conduit and the third conduit.

2. The fryer of claim 1, wherein the at least one fryer vat comprises a plurality of fryer vats, and
the filter system is configured to selectively receive and filter the oil from one of the plurality of fryer vats.

3. The fryer of claim 1, wherein the filter system comprises a pan for receiving the oil directed from the at least one fryer vat.

4. The fryer of claim 3, wherein the filter system further comprises a filter assembly arranged on the pan for filtering the oil directed from the at least one fryer vat.

5. The fryer of claim 1, further comprising a pump connected to the second conduit to move the oil from the filter system therethrough.

6. The fryer of claim 5, wherein the flow control device comprises at least one of a manual valve and an automatic valve.

7. The fryer of claim 6, further comprising a control unit configured to control the automatic valve and the pump.

8. A process of modifying a fryer for oil reclamation comprising:
  providing a fryer vat configured to fry food in oil and a filter system configured to filter the oil drained from the fryer vat via a first conduit having a first valve and send the filtered oil to the fryer vat via a second conduit having a second valve;
  connecting a first end of a third conduit to a portion of the second conduit between the filter system and the second valve;
  connecting an outlet that comprises a fitting to the third conduit between the first end and a second end of the third conduit to direct oil away from an oil reclamation tank;
  connecting a third valve to a portion of the third conduit between the outlet and the second end of the third conduit; and
  connecting the second end of the third conduit to an oil reclamation tank,
  wherein the second end of the third conduit is connectable to the oil reclamation tank.

9. The fryer of claim 1, wherein the flow control device comprises:
  a first valve connected to the first conduit;
  a second valve connected to a portion of the second conduit between the first end of the third conduit and the at least one fryer vat; and
  a third valve connected to a portion of the third conduit between the outlet and the second end of the third conduit,
  wherein the first valve and the third valve are closed and the second valve is open to direct the oil from the filter system to the at least one fryer vat,
  the first valve and the second valve are closed and the third valve is open to direct the oil form the filter system to the oil reclamation tank, and
  the first valve, the second valve and the third valve are closed to direct the oil from the filter system to the outlet.

10. The fryer of claim 1, further comprising a control unit that controls the valve and the flow control device.

11. The process of claim 8, further comprising providing a control unit that controls the first valve, the second valve, and the third valve.

* * * * *